United States Patent
Shteyman

(10) Patent No.: US 9,159,858 B2
(45) Date of Patent: Oct. 13, 2015

(54) THREE-DIMENSIONAL TOTAL INTERNAL REFLECTION SOLAR CELL

(76) Inventor: Alan Shteyman, Brooklyn, NY (US)

(*) Notice: Subject to any disclaimer, the term of this patent is extended or adjusted under 35 U.S.C. 154(b) by 168 days.

(21) Appl. No.: 13/021,075

(22) Filed: Feb. 4, 2011

(65) Prior Publication Data

US 2011/0192447 A1 Aug. 11, 2011

Related U.S. Application Data

(60) Provisional application No. 61/302,205, filed on Feb. 8, 2010.

(51) Int. Cl.
*H01L 31/042* (2014.01)
*H01L 31/048* (2014.01)
*H01L 31/0352* (2006.01)
*H01L 31/054* (2014.01)

(52) U.S. Cl.
CPC ...... *H01L 31/048* (2013.01); *H01L 31/035281* (2013.01); *H01L 31/0547* (2014.12); *Y02E 10/52* (2013.01)

(58) Field of Classification Search
CPC ........... H01I 31/048; H01L 31/035281; H01L 31/0547; Y02E 10/52
USPC .................................................. 136/243–265
See application file for complete search history.

(56) References Cited

U.S. PATENT DOCUMENTS

| | | | |
|---|---|---|---|
| 4,144,095 A * | 3/1979 | Mlavsky | 136/246 |
| RE30,584 E * | 4/1981 | Russell | 136/246 |
| 4,494,529 A | 1/1985 | Lew | |
| 5,538,564 A | 7/1996 | Kaschmitter | |
| 5,646,397 A | 7/1997 | Wenham | |
| 6,515,217 B1 | 2/2003 | Aylaian | |
| 6,881,893 B1 | 4/2005 | Cobert | |
| 2006/0180194 A1 | 8/2006 | Mitsunari | |
| 2008/0041439 A1* | 2/2008 | Achutharaman et al. | 136/244 |
| 2008/0196761 A1* | 8/2008 | Nakano et al. | 136/258 |
| 2009/0014055 A1* | 1/2009 | Beck et al. | 136/246 |
| 2009/0107545 A1 | 4/2009 | Moslehi | |
| 2009/0126795 A1 | 5/2009 | Williams | |
| 2009/0194146 A1 | 8/2009 | Simon | |
| 2010/0116316 A1 | 5/2010 | Moslehi | |
| 2010/0116326 A1 | 5/2010 | Gur | |
| 2010/0210168 A1 | 8/2010 | Sakamoto | |

(Continued)

FOREIGN PATENT DOCUMENTS

| JP | 2004-356397 | * | 12/2004 |
|---|---|---|---|
| WO | WO84/04425 | * | 11/1984 |

OTHER PUBLICATIONS

Translation of Hisashi, JP 2004-356397.*

(Continued)

*Primary Examiner* — Allison Bourke
*Assistant Examiner* — Niki Bakhtiari
(74) *Attorney, Agent, or Firm* — Katarzyna Brozynski

(57) ABSTRACT

A solar cell system may maximize solar cell efficiency and minimize energy loss by collecting as much light as possible, using refraction and total internal reflection. The solar cell system includes a solar cell, a layer of a first transparent material placed on the top end of the solar cell, a layer of a second transparent material filling the interior cavity of the solar cell, a plurality of photo-voltaic surface cells incorporated in the solar cell, and the side walls and bottom end of the solar cell are coated with a reflective material.

12 Claims, 1 Drawing Sheet

(56) References Cited

U.S. PATENT DOCUMENTS

2010/0275972 A1 11/2010 Benitez
2010/0294333 A1 11/2010 Wang
2010/0294356 A1 11/2010 Parikh
2011/0226308 A1* 9/2011 Pang .............................. 136/246

OTHER PUBLICATIONS

Translation of Häring et al., WO84/04425.*

* cited by examiner

Drawings were not modified, text was corrected to better describe Figures.

THREE-DIMENSIONAL TOTAL INTERNAL REFLECTION SOLAR CELL

CROSS-REFERENCE TO RELATED APPLICATIONS

This application claims the benefit of Provisional Application No. 61/302,205 filed Feb. 8, 2010, the contents of which are incorporated herein by reference.

BACKGROUND OF THE INVENTION

The present invention generally relates to solar cells. More specifically, the present invention relates to a three-dimensional (3-D) solar cell that maximizes the solar cell efficiency and minimizes energy loss.

Solar energy generation is an important and growing area in the field of environmentally friendly energy production. A solar cell, also called photo-voltaic cell, is a device that converts the energy of light directly into electricity by the photovoltaic effect. Solar cells are composed of various semiconducting materials, which absorb the different wavelengths in sunlight with different efficiencies. Currently known solar cells typically have the form of a flat structure. Unfortunately having a flat structure with only one type of photo-voltaic material only allows the solar cell to absorb a small portion of the sun's energy. Using multiple types of photo-voltaic materials, which absorb wavelengths in sunlight differently, together in one apparatus; the energy in the spectrum of sunlight can be more fully utilized and a greater proportion of the energy in sunlight can be converted to electricity.

As can be seen, there is a need to provide solar cells that provide more surface area for energy generation and with greater energy conversion efficiency.

SUMMARY OF THE INVENTION

In one aspect of the present invention, a solar cell includes, a layer of a first transparent material placed on the top end of the solar cell, a layer of a second transparent material filling the interior cavity of the solar cell, a plurality of photo-voltaic surface cells incorporated inside the solar cell, and the side walls and bottom end of the solar cell are coated with a reflective material.

In another aspect of the present invention, a solar cell system includes a three-dimensional solar cell, a layer of a first transparent material placed on the top end of the three-dimensional solar cell, a layer of a second transparent material filling the interior cavity of the three-dimensional solar cell, a plurality of photo-voltaic surface cells incorporated in the three-dimensional solar cell, and the side walls and bottom end of the three-dimensional solar cell are coated with a reflective material.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention generally provide a solar cell system that may maximize solar cell efficiency and minimize energy loss by collecting and utilizing as much light as possible.

Figure 1:
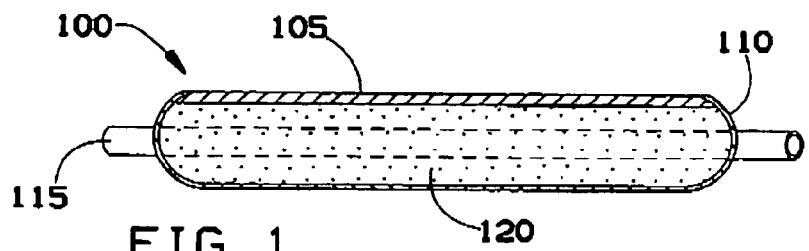
FIG. 1 illustrates a cross sectional view of a solar cell system in accordance with an embodiment of the present invention.

FIG. 1 illustrates a solar cell system 100 includes interior walls and a bottom wall coated with a reflective material, a first transparent material 105 placed on top of the solar cell system 100, a second transparent material 120 placed inside the solar cell, and photo-voltaic surfaces (PVS) 115 connected to the solar cell.

The solar cell 100 may include a three-dimensional configuration that provides the solar cell 100 with more surface area for energy generation compared with the flat 2-dimensional standard solar cell. In addition, the reflective material of the interior walls and bottom 110 of the solar cell 100 may help to distribute the light more efficiently across all the PVS 115.

The first transparent material 105 may be a solid, gel, gas, or liquid material. The first transparent material 105 may be a low loss transparent material with optical properties. In some embodiments, the first transparent material 105 may be poly-methyl methacrylate (Plexiglas®, Lucite®, Perspex®, Optix®), calcium carbonate (calcite), transparent glass, transparent plastic, polycrystalline materials, and single crystal materials. The first transparent material may be a thin layer or thin layers. In some embodiments, the thickness of the layers of the first transparent material 105 may depend on the design. The second transparent material 120 may be a solid, liquid, gas, or gel. In some embodiments, the second transparent material 120 may be poly-methyl methacrylate (Plexiglas®, Lucite®, Perspex®, Optix®), calcium carbonate (calcite), transparent glass, transparent plastic, polycrystalline materials, single crystal materials, water, ethanol, mineral oil, glycerin, air, or nitrogen.

In some embodiments, the second transparent material 120 may be a solid and the first transparent material 105 may be air.

The reflective material may be designed to reflect the maximum amount of light incident upon it, back through the second transparent material 120. The reflective material may be silver plating, aluminum, reflective organic compounds, gold, chrome, silicon oxides, silicon nitrides, or combination thereof.

The PVS cells 115 is made of a photo-voltaic material. The PVS cells 115 may have a geometrical shape. In some embodiments, the shape of the PVS cells 115 may be cylindrical, triangular, hexagonal, pentagonal, hexagonal, heptagonal, octagonal, or a combination thereof. The photo-voltaic material may be made of a single crystal (monocrystalline) or multiple crystals (polycrystalline), or may be amorphous. In some embodiments, the PVS cells 115 may be made of monocrystalline silicon, polycrystalline silicon, amorphous silicon, or cadmium telluride. The PVS cells 115 may work by using the energy of incoming photons to separate free electrons from free holes in the PVS, which are then used to produce the current. The solar cell 100 may include at least one type of PVS cells 115. The PVS cells 115 may be electrically connected in series and/or parallel circuits to produce higher voltages, currents and power levels.

Figure 2:
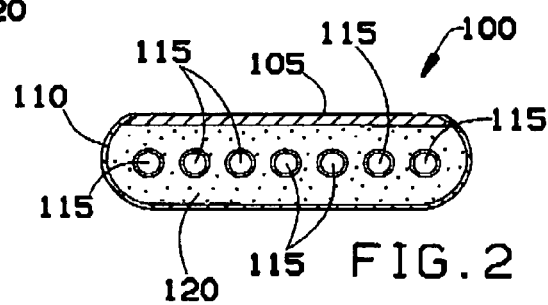
FIG. 2 illustrates a side view of the solar cell system of FIG. 1.
Figure 3:
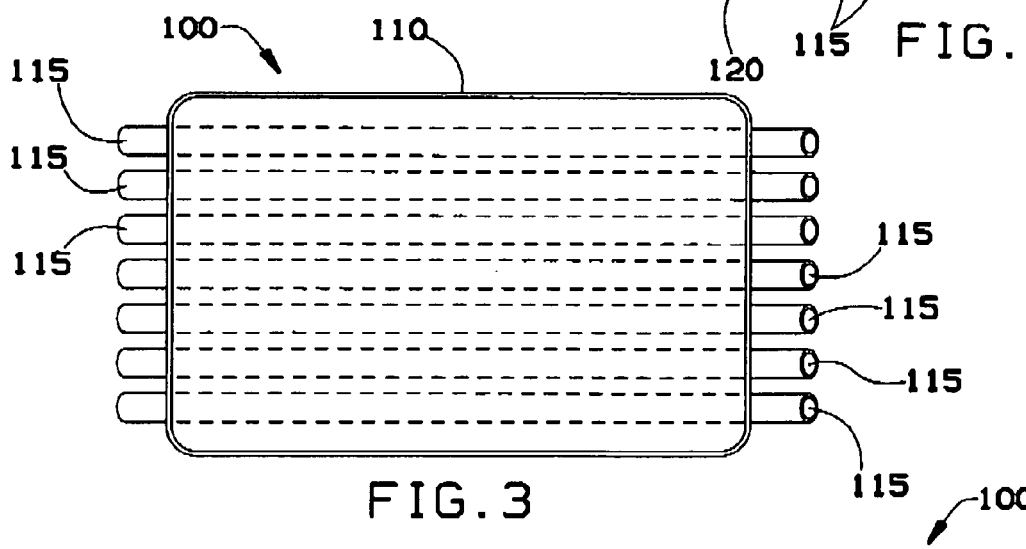
FIG. 3 illustrates a top view of the solar cell system of FIG. 1.

FIGS. 2-3 show that the solar cell 100 may include a plurality of PVS cells 115 connected to the solar cell 100.

Figure 4:
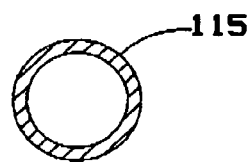
FIG. 4 illustrates a side view of a photo-voltaic surface according to one embodiment of the present invention.

FIG. 4 shows an individual PVS, from the side, showing its three-dimensional structure.

Figure 5:
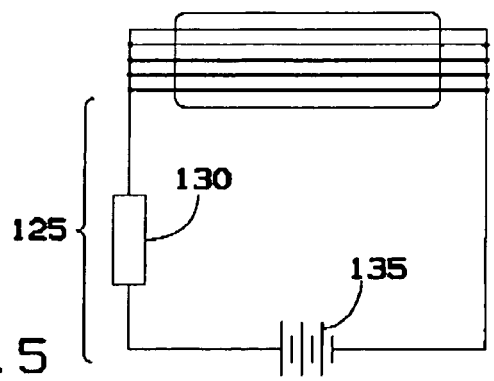
FIG. 5 illustrates a layout of an electrical circuit according to an embodiment of the present invention showing the solar cell system connected to a battery and to an internal resistance.

FIG. 5 shows a layout of an electrical circuit according to some embodiments of the present invention, showing that the solar cell system 100 may be connected to a battery 135 and to an internal resistance 130.

Light may hit the surface of the first transparent material 105 on the solar cell 100. The light may enter the first transparent material 105 until it reaches an interface between the first transparent material 105 and the second transparent material 120. At that point, the light may be slightly refracted. The light may be kept moving within the second transparent material 120 until the light hits the PVS cells 115. Then, the light may be absorbed and turned into a current that can be used for powering electrical systems or may be reflected into the second transparent material 120, starting again the cycle previously described. The light may hit the reflective material of the interior walls or bottom 110 of the solar cell 100 and then reflect off. The light may also hit the interface between the first transparent material 105 and the second transparent material 120. If the light hits the interface at a particular angle, it may be reflected back inside the interior transparent material 120.

The internal refraction at the interface of the first transparent material 105 and second transparent material 120 may allow the solar cell 100 to retain the light as long as possible, thereby causing light to be close to and absorbed by the PVS of the solar cell for maximum conversion into energy.

The user may obtain a solar cell 100 and coat the inside walls and bottom 110 of the solar cell 100 with a reflective material. The solar cell 100 may include openings to introduce a plurality of PVS 115 into the solar cell 100. The PVS 115 may be inserted into the solar cell 100 and the interior cavity of the solar cell 100 may be filled with the second transparent material 120. Then, the first transparent material may be placed on top of the solar cell 100. The PVS 115 may be connected to the appropriate circuitry, which recovers the usable current.

In some embodiments, the solar cell 100 may include heat-absorbing pipes to collect and transport heat. In some embodiments, the solar cell 100 may include fiber optics to collect and transport light.

It should be understood, of course, that the foregoing relates to exemplary embodiments of the invention and that modifications may be made without departing from the spirit and scope of the invention as set forth in the following claims.

What is claimed is:

1. A solar cell system, comprising:
  a substantially planar top end, a substantially planar bottom end, an interior cavity, and side walls extending from the substantially planar bottom end towards the top end, wherein the side walls and the substantially planar bottom end are coated with a light reflective material;
  a first layer comprising a first transparent material covering the top end;
  a second layer comprising a second transparent material filling the interior cavity;
  a plurality of non-planar photovoltaic surface cells with different light-absorbing efficiencies, wherein the photovoltaic surfaces are non-planar in a three-dimensional shape,
  wherein each side wall is generally curved to receive and reflect light into the plurality of non-planar photovoltaic surface cells, and
  wherein light is passed through the first layer and moves within the second layer by either being absorbed by one of the plurality of non-planar photovoltaic surface cells or being reflected off of the side walls or the bottom end until contacting the one of the plurality of non-planar photovoltaic surface cells.

2. The system of claim 1, wherein the first transparent material is thinner than the second transparent material.

3. The system of claim 1, wherein the first transparent material is constructed, in isolation or in combination, from poly-methyl triethacrylate, calcium carbonate, transparent glass, transparent plastic, polycrystalline-materials, or single crystal materials.

4. The system of claim 1, wherein the second transparent material is constructed, in isolation or in combination, from poly-methyl methacrylate, calcium carbonate, transparent glass, transparent plastic, polycrystalline materials, single crystal materials, water, ethanol, mineral oil, glycerin, air, or nitrogen.

5. The system of claim 1, wherein the photo-voltaic surface cells include at least two different types of photovoltaic surfaces, and wherein each cell is hexagonal, cylindrical, triangular, pentagonal, heptagonal, octagonal, or some combination thereof.

6. The solar cell system of claim 1, wherein the solar cell system collects heat and light as well as electrical energy.

7. The system of claim 1, wherein light initially unabsorbed is reflected off of the sidewalls or the bottom end until the light is absorbed by one of the photovoltaic surfaces.

8. The system of claim 1, wherein the first or second layer comprise multiple layers.

9. The system of claim 1, wherein the first layer is air.

10. The system of claim 1, wherein each of the side walls are curved by comprising a distal portion opposite the bottom end, and wherein the distal portion curves inwardly so as to capture and reflect light received through the first layer that is reflected off of the bottom end or other sidewalls.

11. The system of claim 1, wherein each of the side walls is generally orthogonal with the bottom end.

12. The system of claim 1, wherein an internal refraction is caused at the interface of the first layer and the second layer.

* * * * *